(12) United States Patent
Nome Silva et al.

(10) Patent No.: US 8,587,275 B2
(45) Date of Patent: Nov. 19, 2013

(54) INSTANTANEOUS AVERAGE CURRENT MEASUREMENT METHOD

(75) Inventors: Faruk Jose Nome Silva, Sunnyvale, CA (US); Karen Chan, South San Francisco, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 480 days.

(21) Appl. No.: 13/024,013

(22) Filed: Feb. 9, 2011

(65) Prior Publication Data

US 2012/0200277 A1     Aug. 9, 2012

(51) Int. Cl.
*G05F 1/00*     (2006.01)

(52) U.S. Cl.
USPC ............ 323/282; 323/240; 323/242; 323/284; 323/285; 323/288

(58) Field of Classification Search
USPC ......... 323/222, 242, 243, 271, 282, 283, 284, 323/285, 288, 323; 363/15–33
See application file for complete search history.

(56) References Cited

U.S. PATENT DOCUMENTS

| | | | |
|---|---|---|---|
| 5,552,695 A * | 9/1996 | Schwartz | 323/271 |
| 6,426,612 B1 | 7/2002 | Rozsypal | |
| 7,170,267 B1 | 1/2007 | McJimsey | |
| 7,180,274 B2 | 2/2007 | Chen et al. | |
| 7,196,503 B2 | 3/2007 | Wood et al. | |
| 7,250,744 B2 | 7/2007 | Weng | |
| 7,262,628 B2 | 8/2007 | Southwell et al. | |
| 7,471,531 B2 | 12/2008 | Blaha et al. | |
| 7,710,084 B1 | 5/2010 | Guo | |
| 7,795,846 B2 | 9/2010 | Martin | |
| 7,796,365 B2 | 9/2010 | Isham | |
| 7,936,160 B1 * | 5/2011 | Sheehan | 323/285 |
| 2003/0080723 A1 | 5/2003 | Chen et al. | |
| 2007/0080674 A1 | 4/2007 | Gray et al. | |
| 2009/134856 A1 | 5/2009 | Rahman et al. | |
| 2010/0079127 A1 | 4/2010 | Grant | |
| 2010/0164477 A1 | 7/2010 | Trivedi et al. | |

\* cited by examiner

*Primary Examiner* — Nguyen Tran
*Assistant Examiner* — Afework Demisse
(74) *Attorney, Agent, or Firm* — Andrew Viger; W. James Brady; Frederick J. Telecky, Jr.

(57) ABSTRACT

Circuitry and method for providing a signal indicative of instances of conduction of average inductor current in a DC-to-DC voltage converter. Such signal identifies a time when the instantaneous average current being conducted by the inductor in a DC-to-DC voltage converter can be measured by providing a signal edge approximately halfway through one of the increasing and decreasing current conduction intervals of the inductor.

18 Claims, 8 Drawing Sheets

INSTANTANEOUS AVERAGE CURRENT MEASUREMENT METHOD

BACKGROUND

1. Field of the Invention

The present invention relates to voltage regulation circuits and methods, an in particular, to DC-to-DC voltage conversion circuits and methods.

2. Related Art

In switching mode power supply systems, current limiting has two main purposes. The first is to protect circuit components from electrical overstress, and the second is to keep the system operating temperature within a specified range. Accordingly, if the current limiting is not accurate, over sized components and/or heat sinks are required to handle additional power dissipation. Alternatively, the power rating of the power supply must be limited.

However, operating temperature is not related so much to the peak output current as it is to the root mean square (RMS) current, which, in most designs, approximates the average current. In any event, regardless of the average current produced, the power devices (e.g., the switching transistors and output inductor) need to operate in the defined safe operating area (SOA). Accordingly, instantaneous current sensing methods, such as peak or valley current sensing, are generally used.

Unfortunately, the relationship between peak or valley current and the average current is not constant. Ripple variation affects the accuracy of using conventional average current sensing techniques to limit the output current. Factors affecting the ripple include input voltage, output voltage, filter inductance and switching frequency. Input voltage and switching frequency variations are often a requirement and offering higher tolerances may provide a competitive advantage. Therefore, there is incentive to allow output current ripple to vary by more than 50%, thereby often requiring an overdesigned system, including more expensive switching transistors.

Accordingly, there is a need for a current limiting technique that delivers better accuracy by reducing sensitivity to the voltages and the circuit elements and parameters affecting ripple, while maintaining instantaneous SOA protection.

SUMMARY

In accordance with the presently claimed invention, circuitry and method are provided for providing a signal indicative of instances of conduction of average inductor current in a DC-to-DC voltage converter. Such signal identifies a time when the instantaneous average current being conducted by the inductor in a DC-to-DC voltage converter can be measured by providing a signal edge approximately halfway through one of the increasing and decreasing current conduction intervals of the inductor.

In accordance with one embodiment of the presently claimed invention, circuitry for providing a signal indicative of instances of conduction of average inductor current in a DC-to-DC voltage converter includes:

first timing control circuitry responsive to at least a control signal having a signal period P and related to a current conduction of an inductor of a DC-to-DC voltage converter by providing a first timing signal that transitions between first and second signal states substantially as the current conduction transitions between increasing and decreasing current conduction intervals, wherein the signal period P is an inverse of a switching frequency of the DC-to-DC voltage converter; and second timing control circuitry responsive to at least one of the control signal and the first timing signal by providing a second timing signal that transitions between third and fourth signal states approximately halfway through one of the increasing and decreasing current conduction intervals.

In accordance with another embodiment of the presently claimed invention, a computer readable medium includes a plurality of executable instructions that, when executed by an integrated circuit design system, cause the integrated circuit design system to produce:

an integrated circuit (IC) including circuitry for providing a signal indicative of instances of conduction of average inductor current in a DC-to-DC voltage converter, comprising:

first timing control circuitry responsive to at least a control signal having a signal period P and related to a current conduction of an inductor of a DC-to-DC voltage converter by providing a first timing signal that transitions between first and second signal states substantially as the current conduction transitions between increasing and decreasing current conduction intervals, wherein the signal period P is an inverse of a switching frequency of the DC-to-DC voltage converter; and second timing control circuitry responsive to at least one of the control signal and the first timing signal by providing a second timing signal that transitions between third and fourth signal states approximately halfway through one of the increasing and decreasing current conduction intervals.

In accordance with another embodiment of the presently claimed invention, a method of providing a signal indicative of instances of conduction of average inductor current in a DC-to-DC voltage converter includes:

responding to at least a control signal having a signal period P and related to a current conduction of an inductor of a DC-to-DC voltage converter by generating a first timing signal that transitions between first and second signal states substantially as the current conduction transitions between increasing and decreasing current conduction intervals, wherein the signal period P is an inverse of a switching frequency of the DC-to-DC voltage converter; and responding to at least one of the control signal and the first timing signal by generating a second timing signal that transitions between third and fourth signal states approximately halfway through one of the increasing and decreasing current conduction intervals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry. Thus, for example, one or more of the functional blocks may be implemented in a single piece of hardware.

Figure 1:
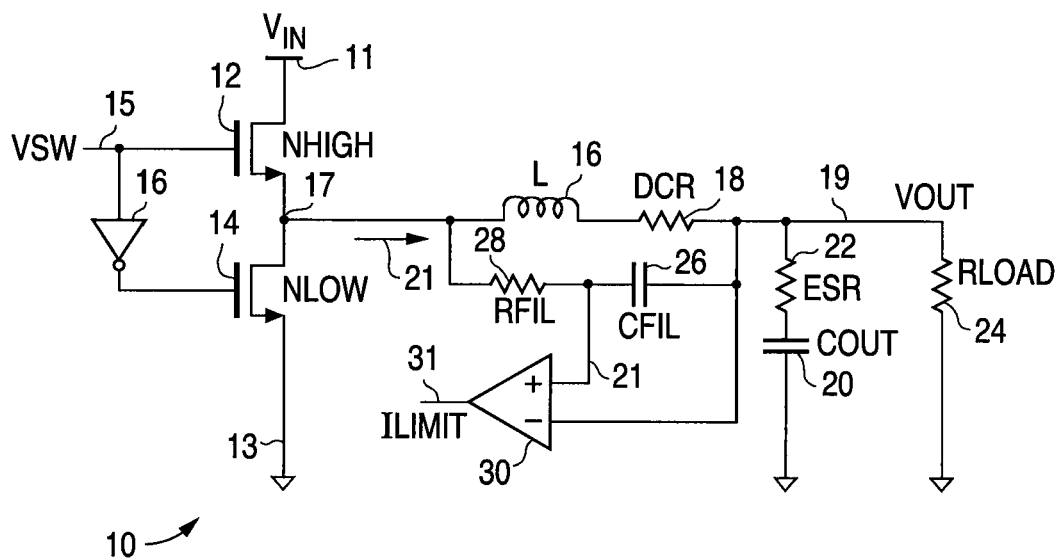
FIG. 1 is a schematic diagram of a conventional DC-to-DC voltage converter.

Referring to FIG. 1, a conventional DC-to-DC voltage converter can be depicted schematically substantially as shown. The DC input voltage 11 is applied across the power switching transistors 12, 14, which are alternately turned on and off by a switching signal 15. The switching signal 15 drives the high side switching transistor 12, and its inverse, e.g., provided by an inverting amplifier 16, drives the low side switching transistor 14. Accordingly, when the high side transistor 12 is on the low side transistor 14 is off, and when the high side transistor 12 is off, the low side transistor 14 is on. This produces a switched voltage 17 that is filtered by a series inductance 16 and shunt capacitance 20 to produce the output voltage 19 for application to the load 24. As is well known in the art, the inductance also includes a series DC resistance (DCR) 18, and the output capacitance 20 includes an equivalent series resistance (ESR) 22.

Typically, current sensing is accomplished by using an RC filter which includes serially connected capacitance 26 and resistance 28 connected in parallel with the inductance 16 and DC resistance 18. As is well known in the art, the RC filter components 26, 28 are selected to make the RC time constant equal to the IL/DCR time constant of the inductive element. The output voltage 19 and RC-filtered voltage 21 are compared in an error amplifier to produce a current sensing signal 31 used for controlling limiting of the output current 21 in accordance with well known techniques.

Figure 2:
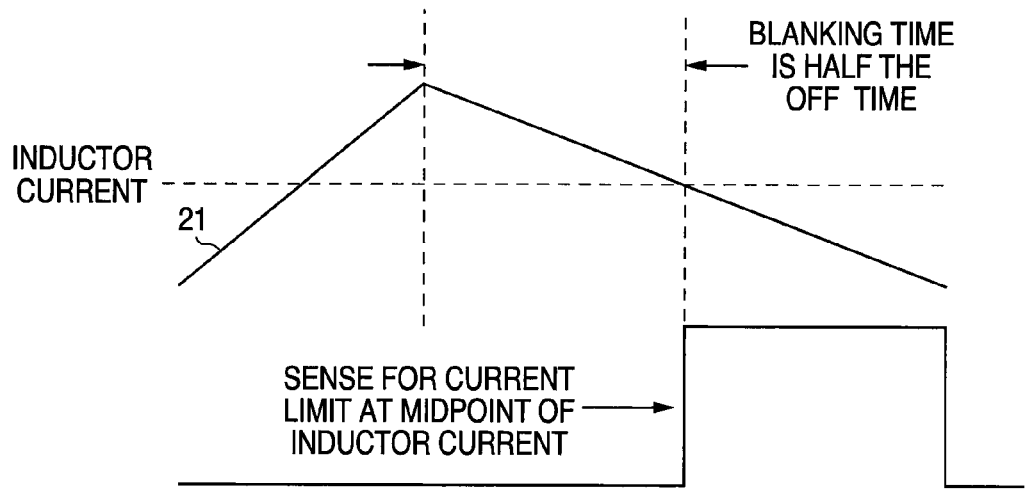
FIG. 2 is a signal timing diagram depicting enablement of current sensing during the inductor current off time.

Referring to FIG. 2, in accordance with one embodiment of the presently claimed invention and discussed in more detail below, the midpoint of the inductor current 21 during the "off" time (i.e., when the high side transistor 12 is off and the low side transistor 14 is on) is detected, and a signal is asserted to identify the average inductor current for use in enabling or initiating current sensing during the on time.

Figure 3:
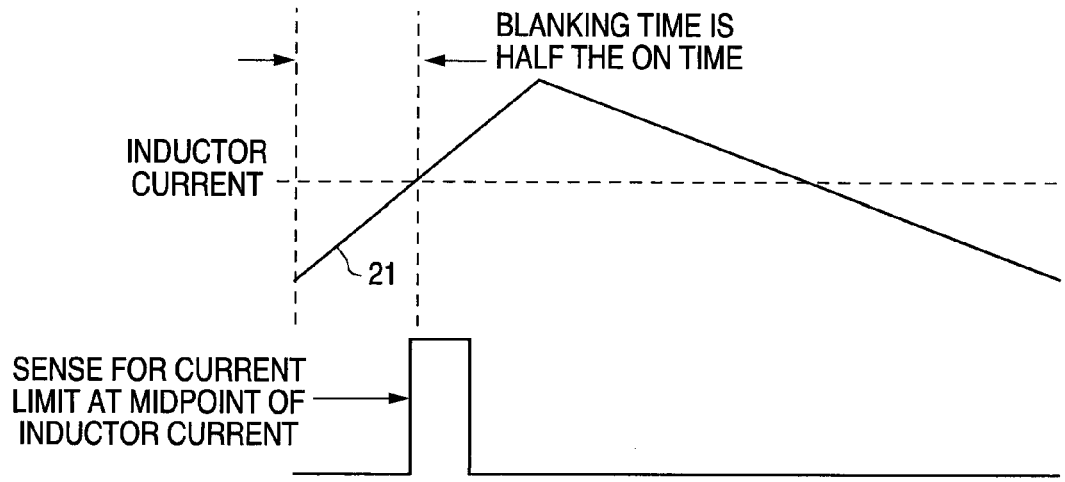
FIG. 3 is a signal timing diagram depicting enablement of current sensing during the inductor current on time.

Referring to FIG. 3, in accordance with another embodiment of the presently claimed invention and discussed in more detail below, the midpoint of the inductor current 21 during the "off" time (i.e., when the high side transistor 12 is on and the low side transistor 14 is off) is detected, and signal is asserted to identify the average inductor current for use in enabling or initiating current sensing during the off time.

Figure 4:
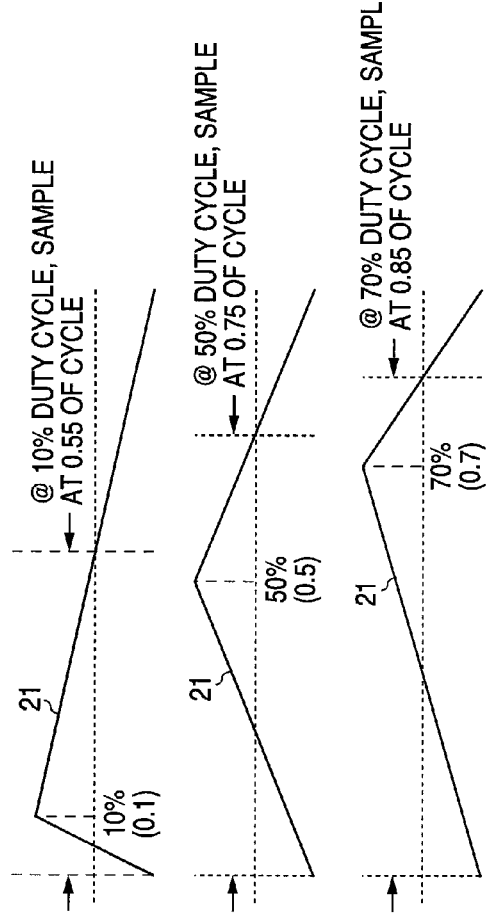
FIG. 4 is a signal timing diagram depicting how the switching signal duty cycle affects timing of the enablement of current sensing.

Referring to FIG. 4, as discussed in more detail below, sensing the midpoint of the output current 21, e.g., during the off time, can be achieved irrespective of the duty cycle D of the switching signal 15 (FIG. 1) in accordance with the following relationship:

$$D+([1-D]/2=D/2+0.5=0.5*(D+1)$$

Accordingly, with a duty cycle D of 50%, a midpoint of the output current 21 during the off time is found to be at 0.75 of the period of the switching signal 15.

Figure 5:
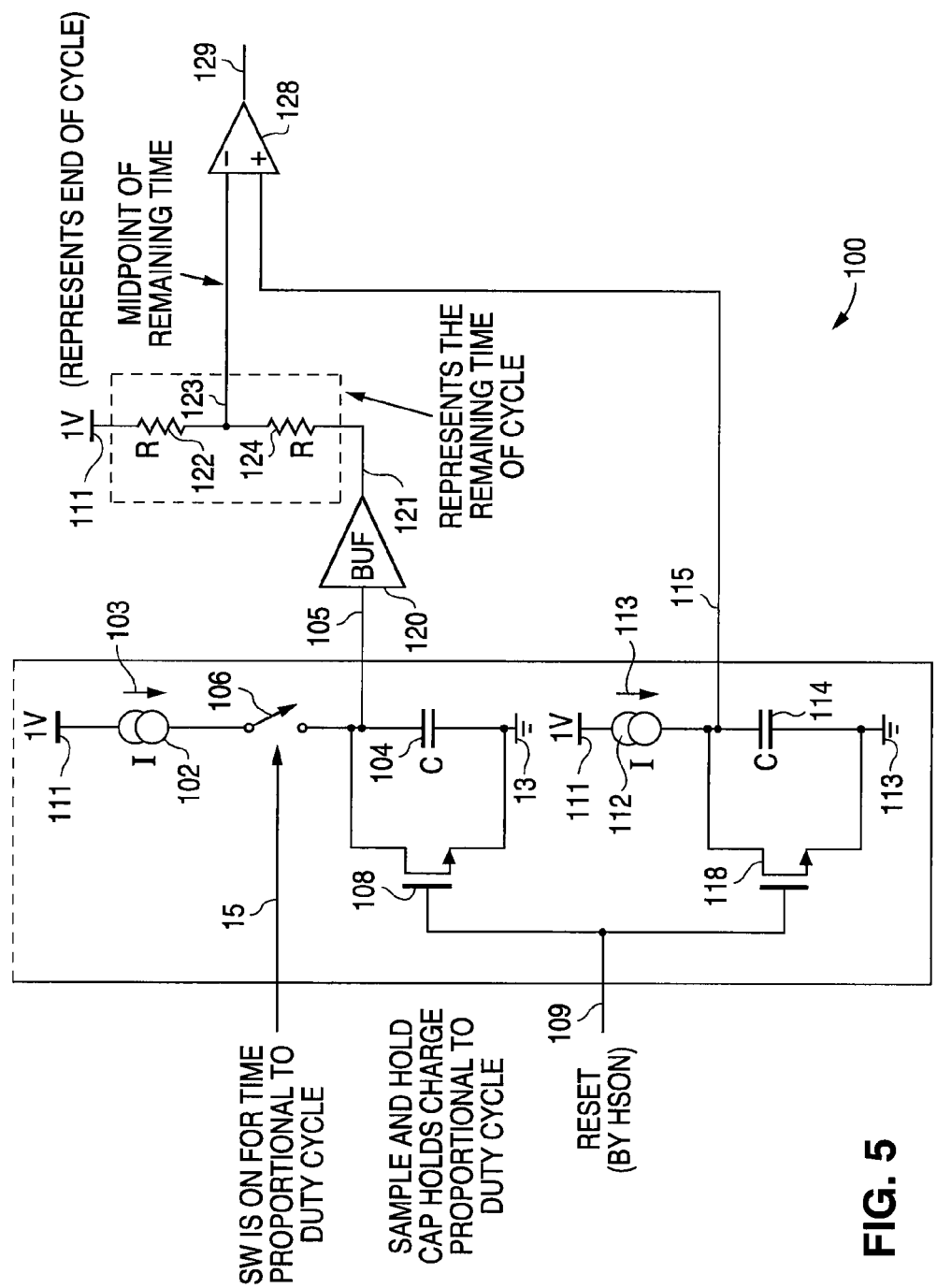
FIG. 5 is a schematic diagram of enablement circuitry in accordance with an exemplary embodiment of the presently claimed invention.

Referring to FIG. 5, in accordance with an exemplary embodiment of the presently claimed invention, an enablement circuit 100 for current sensing includes matching current sources 102, 112 and capacitors 104, 114. The current sources 102, 112 provide matching currents 103, 113 for charging the capacitors 104, 114, i.e., at equal charging ramp rates. However, while the lower capacitor 114 is charged throughout the period of the switching frequency, a switch 106 allows the upper capacitor 104 to charge only during an interval proportional, e.g., equal, to the duty cycle D of the switching signal 15. At the beginning of the charging interval, a reset signal 109 briefly turns on switches in the form of transistors 108, 118 connected across the capacitors 104, 114 to discharge the capacitors 104, 114.

The upper ramping voltage 105 is buffered or level shifted with a buffer amplifier or level shifter 120. The resulting voltage 121 is applied at the bottom of a resistive voltage divider 122, 124, which is biased by a voltage 111 (e.g., 1 volt) representing the end of the switching signal. The resulting divided voltage 123 corresponds to the midpoint of the off time (FIGS. 2 and 4). This voltage 123 is compared with the lower ramp voltage 115 in a voltage comparator 128. Accordingly, when the lower ramp voltage 115 transcends the divided voltage 123, the output signal 129 is asserted, thereby identifying the point in time at which the mid point of the off time (and off time current) has been reached.

Figure 6:
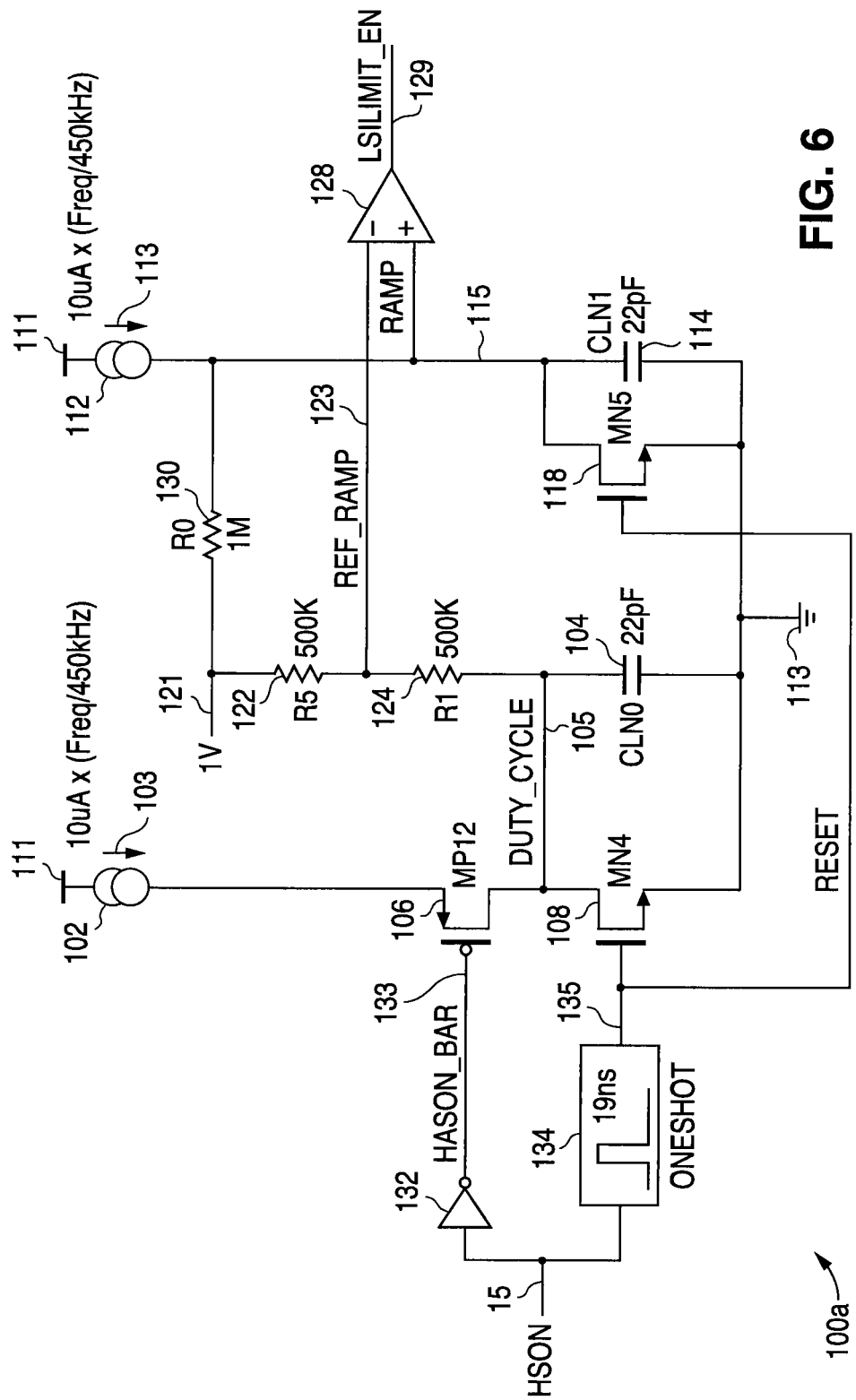
FIG. 6 is a schematic diagram of an exemplary embodiment of the circuit of FIG. 5.

Referring to FIG. 6, an exemplary embodiment 100a of the circuit 100 of FIG. 5 can be implemented substantially as shown. The switch 106 is implemented as a P-type MOSFET, while the reset transistors 108, 118 are N-type MOSFETs. The switching signal 15 corresponds to the high side on interval (i.e., during which the upper power switch 12 is turned on and lower power switch 14 is turned off (FIG. 1)). This signal 15 is inverted with an inverting amplifier 132 to provide the necessary inverted signal 133 for the P-MOSFET 106. The switching signal 15 also drives a one-shot circuit 134, which provides a narrow signal pulse 135 to briefly turn on the reset transistors 108, 118 to discharge the capacitors 104, 114.

At this point in time, the reference ramping voltage 123 begins at 0.5 volt (the difference between the one volt bias voltage 111 and the initially zero volts across the discharged capacitor 104). Following the de-assertion of the one shot pulse 135, the capacitors 104, 114 begin charging at equal ramp rates during the high, or asserted, state of the switching signal 15. Following de-assertion of the switching signal 15, the switching transistor 106 turns off, thereby causing the voltage 105 across the capacitor 104 to stop changing and remain fixed, as the capacitor 104 is no longer being charged. Hence, this voltage 105 will have a magnitude proportional to the duty cycle D of the switching signal 15.

As discussed above, once the other capacitor 114 charges to a voltage 115 equal to the reference ramping voltage 123 the output signal 129 is asserted for use in enabling or initiating sensing and limiting of the inductor current 21 (FIG. 1) in accordance with well known techniques.

Figure 7:
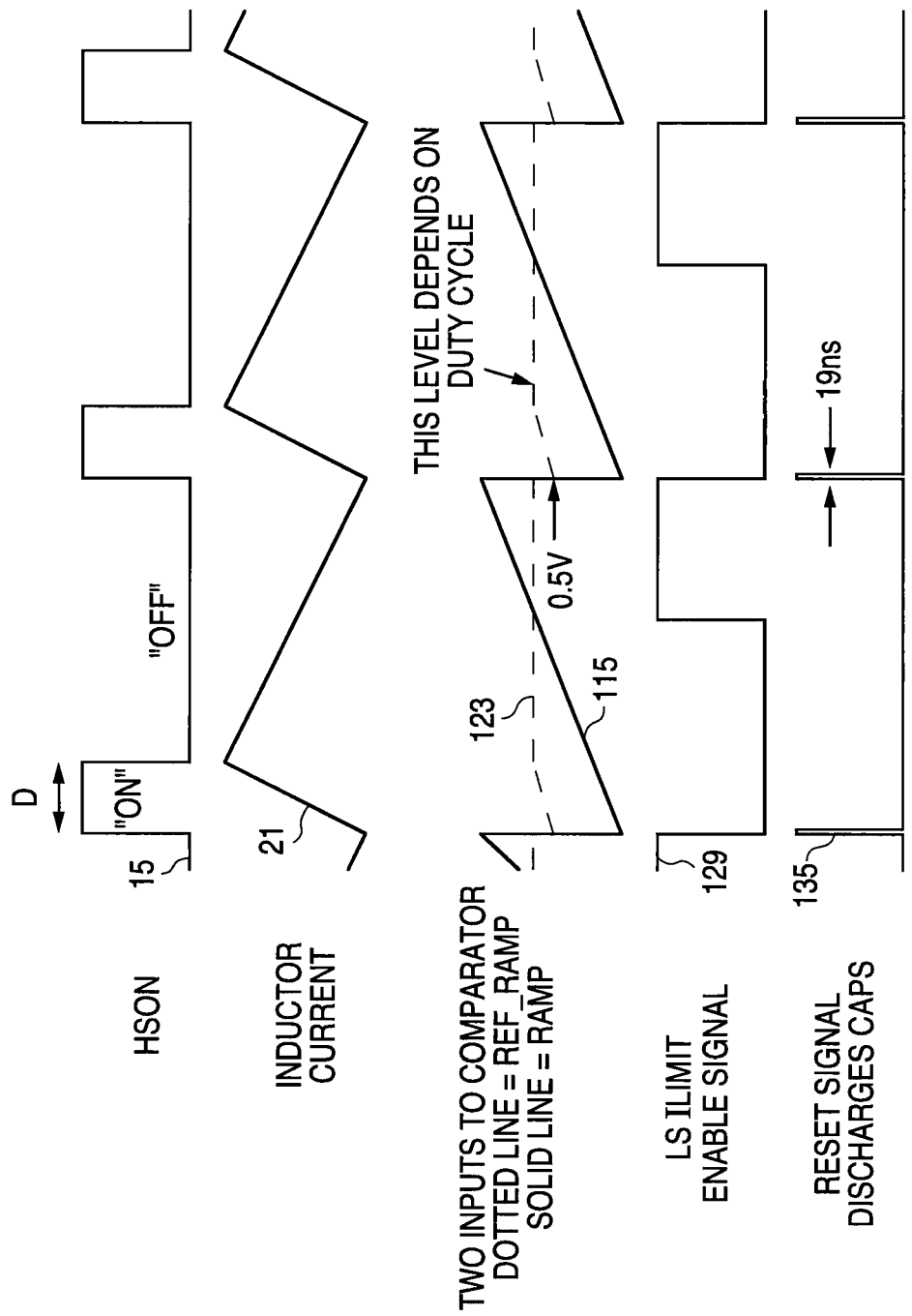
FIG. 7 is a signal timing diagram for the circuit of FIG. 6.

Referring to FIG. 7, the waveforms of the signals 15, 21, 123, 115, 129, 135 discussed above can be depicted as shown. As discussed above, the switching signal 15 is asserted during the on time, i.e., during which the inductor current is increasing, and is de-asserted during the off-time, i.e., during which the inductor current is decreasing. Following discharging of the capacitors 104, 114 by the application of the one shot pulse 135, the capacitors 104, 114 begin charging, thereby producing their respective ramping voltages 123, 115. Upon de-assertion of the switching signal 15, the first ramping voltage stops changing and remains constant at a value proportional to the duty cycle D. Once the second ramping voltage 115 achieves this same voltage magnitude, the output signal 129 becomes asserted.

Figure 8:
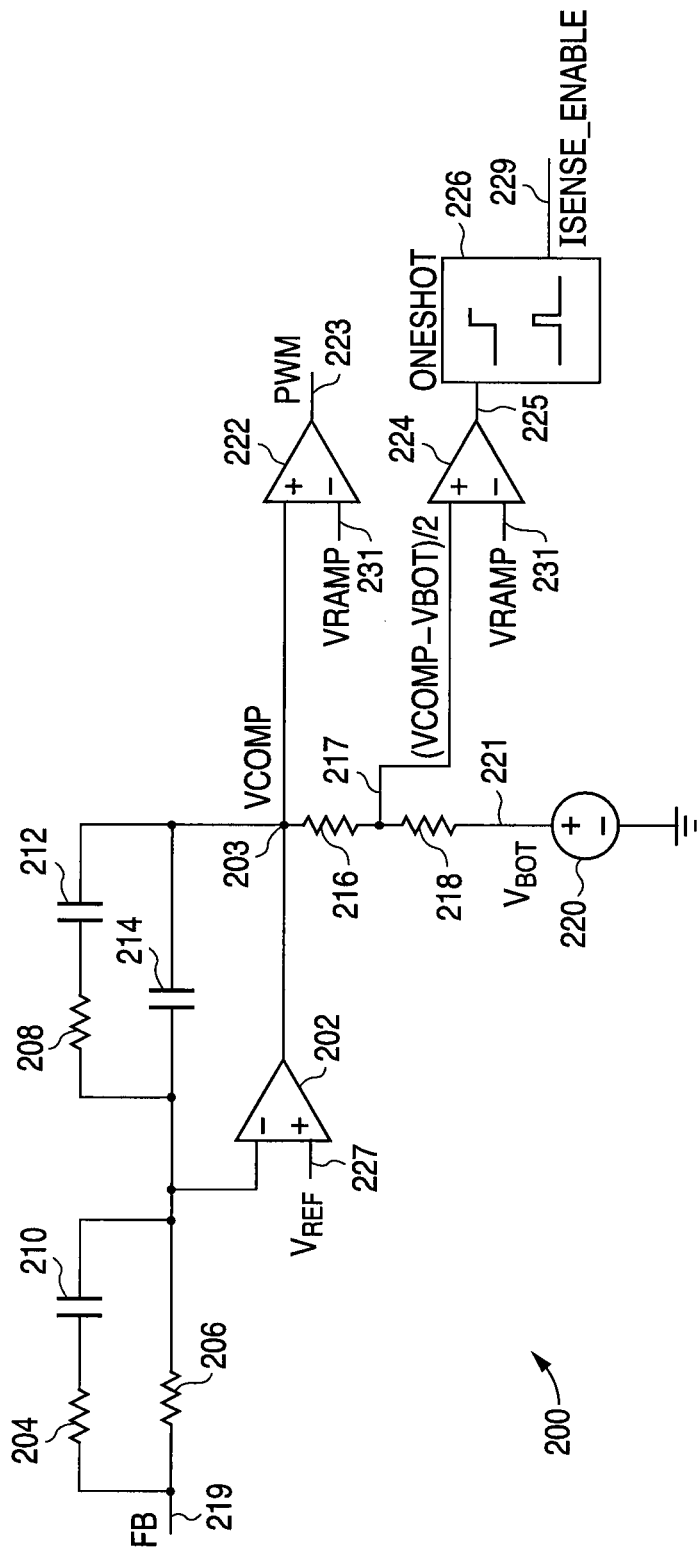
FIG. 8 is a schematic diagram of an enablement circuit in accordance with another exemplary embodiment of the presently claimed invention.

Referring to FIG. 8, an enablement circuit 200 in accordance with another exemplary embodiment can be implemented for identifying the midpoint of the on time. A feedback voltage 219, which is a predetermined fraction of the output voltage 19 (FIG. 1), is integrated by a voltage integrator implemented by a differential amplifier 202 and input and feedback RC networks formed with resistors 204, 206, 208 and capacitors 210, 212, 214. The integrated voltage 203 is compared in a voltage comparator 222 to a voltage ramp 229 to provide a pulse width modulated signal 223. The integrated voltage 203 is also divided by a voltage divider 216, 218 biased by a voltage source 220 providing a fixed voltage 221 (e.g., in the range of 1 to 2 volts). The resulting divided voltage 217 is compared against the voltage ramp 229 in another voltage comparator 224. When the voltage ramp 231 becomes equal to this voltage 217, the output signal 225 is asserted and triggers a one-shot circuit 226 to produce an output signal 229 for use in enabling or initiating current sensing and limiting. The voltage ramp 231 has a signal period equal to that of the switching signal 15 (FIG. 1).

Figure 9:
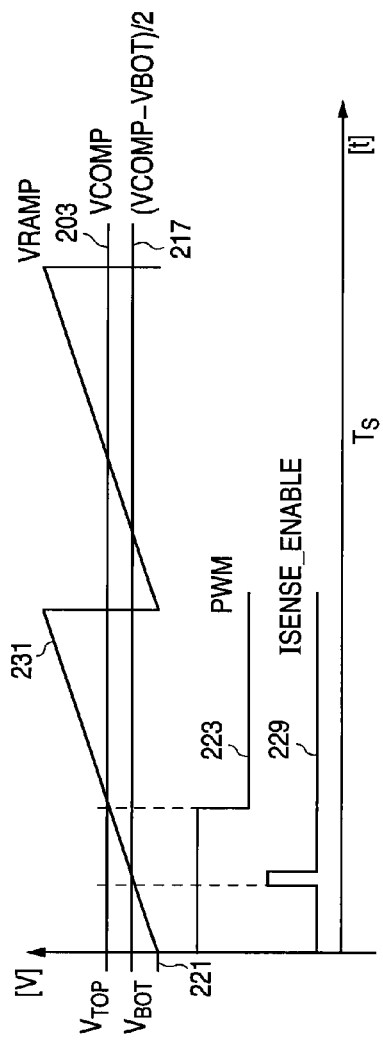
FIG. 9 is a signal timing diagram or the circuit of FIG. 8.

Referring to FIG. 9, the voltages 203, 217, 221 and signals 231, 223, 229 can be depicted as shown. As shown, the voltage ramp 231, which can be provided by voltage ramp circuitry (not shown), many types of which are well known in the art, begins at the bias voltage 221 of the voltage divider 216, 218. As this voltage 231 ramps up, it crosses the divided voltage 217 and integrated voltage 203, at which points the output signal 229 is asserted and the pulse width modulation signal 223 is de-asserted, respectively.

Figure 10:
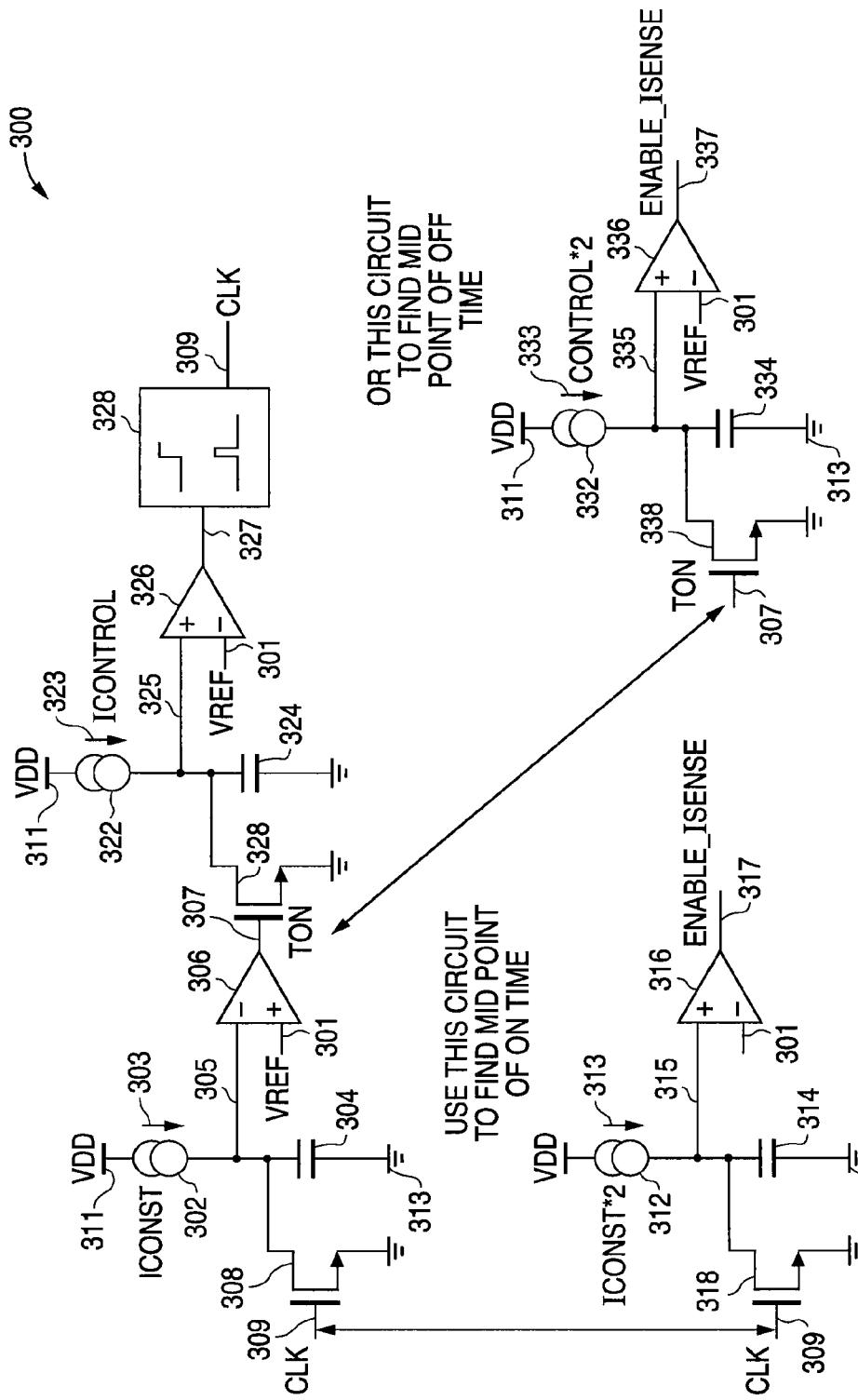
FIG. 10 is a schematic diagram of enablement circuitry in accordance with another exemplary embodiment of the presently claimed invention.

Referring to FIG. 10, enablement circuitry 300 in accordance with another embodiment of the presently claimed invention can be self-driven in the sense that it need not be triggered by the switching signal 15 and, instead, generates its own signal corresponding to the on time.

A current source 302 provides a constant current 303 for charging a capacitor 304. A narrow clock pulse 309 briefly turns on a shunt transistor 308 to initially discharge the capacitor 304. As the capacitor 304 charges with the charging current 303, a voltage ramp 305 is generated and compared against a reference voltage 301. When this ramp reaches the magnitude of the reference voltage 301, the voltage comparator 306 drives its out put signal 307 low. Prior to that, this output signal 307 was asserted, or high. The duration of the high state of this signal 307 corresponds to the on time.

With this signal 307 going low, the second shunting transistor 328 is disabled, thereby allowing another capacitor 324 to begin charging with the constant current 323 provided by another current source 322. The resulting voltage ramp 325 is compared against the reference voltage 301 with another voltage comparator 326. When this ramp voltage 325 reaches the value of the reference voltage 301, the comparator output signal 327 is asserted high, thereby triggering a one-shot circuit 328 that provides the narrow clock pulse 309. As discussed above, this clock pulse 309 discharges the input capacitor 304, and thereby causes this process to repeat. The duration of the high state of the comparator signal 327 corresponds to the off time.

Another current source 312 provides a constant current 313 having double the magnitude of the first constant current 303. This current 313 charges another capacitor 314, which is initially discharged by a shunt transistor 318 driven by the clock pulse 309. The resulting voltage ramp 315 ramps at a rate double the rate of the first voltage ramp 305. When this voltage ramp 315 becomes equal to the reference voltage 301, the voltage comparator 316 drives its output signal 317 high. Assertion of this signal 317 identifies the midpoint of the on time and can be used for enabling or initiating sensing and limiting of the inductor current 21.

Alternatively, if the midpoint of the off time is to be identified, another current source 332 is used to provide a constant current 333 having a magnitude double that of the second current 323 to charge another capacitor 334, which is initially discharged by a shunt transistor 338 driven by the signal 307 corresponding to the on time. Accordingly, following the on time, i.e., during the off time, this signal 307 is low, thereby allowing the capacitor 334 to be charged by the current 333. The resulting voltage ramp 335 is compared to the reference voltage 301 by another voltage comparator 336. When this ramp voltage 335 becomes equal to the reference voltage 301, the voltage comparator 336 drives its output signal 337 high. Accordingly, assertion of this signal 337 identifies the midpoint of the off time and can be used for enabling or initiating sensing and limiting of the inductor current 21.

Figure 11:
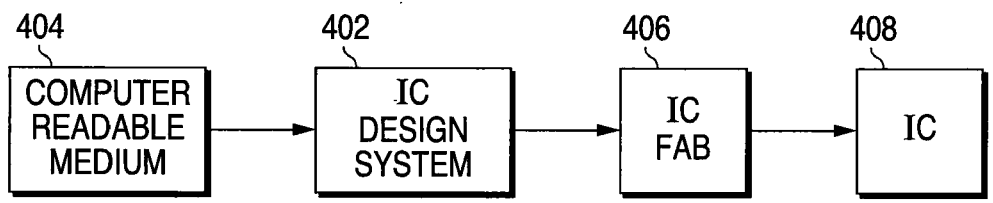
FIG. 11 is a functional block diagram of an exemplary embodiment of an integrated circuit design and fabrication system operated in accordance with computer instructions.

Referring to FIG. 11, integrated circuit (IC) design systems 402 (e.g., work stations with digital processors) are known that create integrated circuits based on executable instructions stored on a computer readable medium 404, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instructions (e.g., computer code) that, when executed by the IC design system 404 (e.g., by a work station or other form of computer), cause an IC fabrication system 406 to produce an IC 408 that includes the devices or circuitry as set forth herein.

Accordingly, the devices or circuits described herein may be produced as ICs 408 by such IC design systems 402 executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including circuitry for providing a signal indicative of instances of conduction of average inductor current in a DC-to-DC voltage converter, comprising:
    first timing control circuitry responsive to at least a control signal having a signal period P and related to a current conduction of an inductor of a DC-to-DC voltage converter by providing a first timing signal that transitions between first and second signal states substantially as said current conduction transitions between increasing and decreasing current conduction intervals, wherein said signal period P is an inverse of a switching frequency of said DC-to-DC voltage converter; and
    second timing control circuitry responsive to at least one of said control signal and said first timing signal by providing a second timing signal that transitions between third and fourth signal states approximately halfway through one of said increasing and decreasing current conduction intervals.

2. The apparatus of claim 1, wherein said first and second signal states comprise mutually opposing signal states.

3. The apparatus of claim 1, wherein said third and fourth signal states comprise mutually opposing signal states.

4. The apparatus of claim 1, wherein said one of said increasing and decreasing current conduction intervals comprises a current charging interval of said inductor.

5. The apparatus of claim 4, wherein said current charging interval comprises a current charging time interval of said inductor.

6. The apparatus of claim 1, wherein said one of said increasing and decreasing current conduction intervals comprises a current discharging interval of said inductor.

7. The apparatus of claim 6, wherein said current discharging interval comprises a current discharging time interval of said inductor.

8. The apparatus of claim 1, wherein:
    said first timing control circuitry comprises first voltage ramp circuitry responsive to said control signal by providing said first timing signal which includes a first ramping voltage during a first time interval T1 and a substantially constant voltage during a second time interval T2 following said first time interval T1; and
    said second timing control circuitry comprises
        voltage division circuitry coupled to said first voltage ramp circuitry and responsive to a reference voltage and said first timing signal by providing a divided voltage related to a difference between said reference voltage and said first timing signal,
        second voltage ramp circuitry responsive to said control signal by providing a second ramping voltage during said first and second time intervals, and
        voltage comparison circuitry coupled to said second voltage ramp circuitry and said voltage division circuitry, and responsive to said first timing signal and said second ramping voltage by providing said second timing signal.

9. The apparatus of claim 1, wherein:
    said first timing control circuitry comprises
        first voltage ramp circuitry responsive to said control signal by providing a first ramping voltage having a first ramp rate, and
        first voltage comparator circuitry coupled to said first voltage ramp circuitry and responsive to said first ramping voltage by providing said first timing signal when said first ramping voltage transcends a first reference value; and
    said second timing control circuitry comprises
        second voltage ramp circuitry responsive to said control signal by providing a second ramping voltage having a second ramp rate substantially double said first ramp rate, and
        second voltage comparator circuitry coupled to said second voltage ramp circuitry and responsive to said second ramping voltage by providing said second timing signal when said second ramping voltage transcends a second reference value.

10. The apparatus of claim 1, wherein:
    said first timing control circuitry comprises
        first voltage ramp circuitry responsive to said control signal by providing a first ramping voltage having a first ramp rate,
        first voltage comparator circuitry coupled to said first voltage ramp circuitry and responsive to said first ramping voltage by providing said first timing signal when said first ramping voltage transcends a first reference value,
        second voltage ramp circuitry coupled to said first voltage comparator circuitry and responsive to said first timing signal providing a second ramping voltage having a second ramp rate, and
        second voltage comparator circuitry coupled to said second voltage ramp circuitry and responsive to said second ramping voltage by providing said control signal when said second ramping voltage transcends a second reference value; and
    said second timing control circuitry comprises
        third voltage ramp circuitry responsive to said first timing signal by providing a third ramping voltage having a third ramp rate substantially double said second ramp rate, and
        third voltage comparator circuitry coupled to said third voltage ramp circuitry and responsive to said third ramping voltage by providing said second timing signal when said third ramping voltage transcends a third reference value.

11. A non-transitory computer readable medium comprising a plurality of executable instructions that, when executed by an integrated circuit design system, cause the integrated circuit design system to produce: an integrated circuit (IC) including circuitry for providing a signal indicative of instances of conduction of average inductor current in a DC-to-DC voltage converter, comprising: first timing control circuitry responsive to at least a control signal having a signal period P and related to a current conduction of an inductor of a DC-to-DC voltage converter by providing a first timing signal that transitions between first and second signal states substantially as said current conduction transitions between increasing and decreasing current conduction intervals, wherein said signal period P is an inverse of a switching frequency of said DC-to-DC voltage converter; and second timing control circuitry responsive to at least one of said control signal and said first timing signal by providing a second timing signal that transitions between third and fourth signal states approximately halfway through one of said increasing and decreasing current conduction intervals.

12. A method of providing a signal indicative of instances of conduction of average inductor current in a DC-to-DC voltage converter, comprising:

responding to at least a control signal having a signal period P and related to a current conduction of an inductor of a DC-to-DC voltage converter by generating a first timing signal that transitions between first and second signal states substantially as said current conduction transitions between increasing and decreasing current conduction intervals, wherein said signal period P is an inverse of a switching frequency of said DC-to-DC voltage converter; and responding to at least one of said control signal and said first timing signal by generating a second timing signal that transitions between third and fourth signal states approximately halfway through one of said increasing and decreasing current conduction intervals.

13. The method of claim 12, wherein said first and second signal states comprise mutually opposing signal states.

14. The method of claim 12, wherein said third and fourth signal states comprise mutually opposing signal states.

15. The method of claim 12, wherein said one of said increasing and decreasing current conduction intervals comprises a current charging interval of said inductor.

16. The method of claim 15, wherein said current charging interval comprises a current charging time interval of said inductor.

17. The method of claim 12, wherein said one of said increasing and decreasing current conduction intervals comprises a current discharging interval of said inductor.

18. The method of claim 17, wherein said current discharging interval comprises a current discharging time interval of said inductor.

* * * * *